United States Patent
Lin et al.

(10) Patent No.: US 6,960,491 B2
(45) Date of Patent: Nov. 1, 2005

(54) INTEGRATED CIRCUIT PACKAGING FOR IMPROVING EFFECTIVE CHIP-BONDING AREA

(75) Inventors: Chung-Hung Lin, Tainan (TW); Cho-Liang Chung, Fengshan (TW); Ming-Liang Huang, Kaohsiung (TW); Jesse Huang, Kaohsiung (TW)

(73) Assignees: ChipMOS Technologies (Bermnuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/721,288

(22) Filed: Nov. 26, 2003

(65) Prior Publication Data

US 2004/0106233 A1 Jun. 3, 2004

(30) Foreign Application Priority Data

Nov. 29, 2002 (TW) .................................. 91135243 A

(51) Int. Cl.$^7$ ............................................. H01L 21/00
(52) U.S. Cl. ...................................... 438/108; 438/127
(58) Field of Search ................................ 438/106–127

(56) References Cited

U.S. PATENT DOCUMENTS

| | | | | |
|---|---|---|---|---|
| 4,601,944 A | * | 7/1986 | Zussman | 442/168 |
| 5,955,021 A | | 9/1999 | Tiffany, III | 264/272.11 |
| 5,972,735 A | | 10/1999 | Dominic | 438/118 |
| 6,479,323 B1 | | 11/2002 | Lo et al. | 438/111 |
| 6,518,095 B1 | * | 2/2003 | Akutsu | 438/118 |
| 6,689,638 B2 | * | 2/2004 | Lin et al. | 438/118 |

FOREIGN PATENT DOCUMENTS

| | | |
|---|---|---|
| EP | 0 421 579 | 4/1991 |
| JP | 3011757 | 1/1991 |
| TW | 20000125608 | 9/2001 |

* cited by examiner

*Primary Examiner*—Richard A. Booth
(74) *Attorney, Agent, or Firm*—Troxell Law Office, PLLC

(57) ABSTRACT

A packaging process for improving effective chip-bonding area is disclosed in the present invention. An A-stage liquid paste is formed on a substrate and partially cured to become a B-stage film layer. The B-stage film layer is maintained without fully cured passing through a chip-attaching step and an electrically connecting step. During the molding step, the packing pressure for the molding compound (1000 psi~1500 psi) is larger than the chip attaching pressure for enabling the B-stage film layer to be closely compressed in order to improve effective chip-bonding area. The B-stage film layer and the molding compound are cured simultaneous in the molding step.

16 Claims, 6 Drawing Sheets

INTEGRATED CIRCUIT PACKAGING FOR IMPROVING EFFECTIVE CHIP-BONDING AREA

FIELD OF THE INVENTION

The present invention is relating to a process for making an integrated circuit package, particularly to a process for making an integrated circuit package for improving effective chip-bonding area using a B-stage film layer as a chip bond material.

BACKGROUND OF THE INVENTION

It is conventional technique to utilize B-stage compound to be a chip bond material, as disclosed in R.O.C. Taiwan Patent No. 455,970 entitled "multi-chip stacked package". The conventional B-stage compound is used for adhering two chips, it won't produce a stress between the two chips because the two chips have a same thermal coefficient. Also the B-stage compound is sealed inside the molding compound, so that the adhesive strength of the B-stage compound is not demanded severely.

When a B-stage compound is directly configured to adhere a chip to a substrate in integrated circuit package. As showed in FIG. 1, at first a B-stage compound 13 is applied to the chip-attaching surface 11 of the substrate 10. Next, the back surface 23 of the chip 20 is compressed to the chip-attaching surface 11 of the substrate 10. The B-stage compound 13 is heated while compressed to become a fully cured C-stage film layer 13 that adheres the chip 20 to the substrate 10 during the chip-attaching step. The C-stage film layer 13 will not have any change in physical phase and any chemical reaction in the sequent process especially the molding step. Bonding wires 30 that are formed by wire-bonding technique connect the bonding pads 21 on the active surface 22 of the chip 20 with the pads 12 of the substrate 10, next a molding step is executed. However, the B-stage compound 13 is formed by printing or other liquid dispensing method so as not to have an attaching surface that is not flat completely, and cannot substantially adhere the chip 20 and the substrate 10 by the chip 20 attaching pressure. A popcorn defect is easy to happen while executing reliability test such as moisture or burn-in test after packaging. Therefore, when the chip 20 is separated from the substrate 10 prior to molding in a test, it is evident that the C-stage film layer 13 on the substrate 10 has a bad effective chip-bonding area merely 50% approximately against the entire chip-bonding region of the substrate 10, even smaller than 30% (as showed in FIG. 2). For that reason, the C-stage film layer 13 formed in chip-attaching step of the conventional process is not good enough to adhere the chip 20 and the substrate 10, also there are voids or gaps between the chip 20 and the substrate 10.

SUMMARY

In accordance with a first aspect of the invention there is provided a process for making an integrated circuit package comprising the steps of: providing a substrate having a chip-attaching surface; applying an A-stage liquid paste on the chip-attaching surface of the substrate, the A-stage liquid paste including a thermosetting material and a solvent; heating the substrate to remove the solvent of the A-stage liquid paste in a manner that the A-stage liquid paste is transformed into a dry B-stage film layer; attaching a chip to the chip-attaching surface of the substrate by the B-stage film layer, the B-stage film layer being maintained in a partially cured condition; electrically connecting the chip with the substrate having the B-stage film layer; and forming a molding compound on the chip-attaching surface of the substrate, the packing pressure for the molding compound being larger than the chip-attaching pressure in a manner that the partially-cured B-stage film layer re-bonds the chip to improve effective chip-bonding area.

As the packing pressure for the molding compound is larger than the chip-attaching pressure, the B-stage film layer can further closely re-bond the chip for improving effective chip-bonding area in molding step.

In a second aspect of the invention, there is provided a process for making an integrated circuit package comprising the steps of: providing a substrate having a chip-attaching surface; applying an A-stage liquid paste on the chip-attaching surface of the substrate; heating the substrate to transform the A-stage liquid paste into a B-stage film layer, the B-stage film layer having a glass transition temperature (Tg); attaching a chip to the chip-attaching surface of the substrate, the substrate is heated being higher than the glass transition temperature (Tg) of the B-stage film layer to make the B-stage film layer adhere the substrate and the chip, and the B-stage film layer being maintained in a partially-cured condition; electrically connecting the chip with the substrate having the B-stage film layer; and forming a molding compound on the chip-attaching surface of the substrate, the packing pressure for the molding compound being larger than the chip-attaching pressure in a manner that the partially-cured B-stage film layer re-bonds the chip to improve effective chip-bonding area.

As the B-stage film layer has a glass transition temperature (Tg) lower than chip-attaching temperature and has a thermosetting temperature lower than thermosetting temperature of the molding compound, the B-stage film layer can be closely compressed between the chip and the substrate to remove gaps or voids in the molding step.

The packing pressure for the molding compound is preferably approximately 6.9 MPa (1000 psi) to 10.3 MPa (1500 psi), which is larger than the chip-attaching pressure, so that the B-stage film layer can be closely compressed to re-bond the chip in order to improve the effective chip-bonding area. The heating temperature in the molding step is preferably approximately 150° C. to 200° C., which is higher than the fully curing temperature of the B-stage film layer, so as to cure the B-stage film layer and the molding compound simultaneously.

From FIG. 4A to FIG. 4F are cross sectional views of the substrate in the packaging process in accordance with the embodiment of the present invention.

Figure 5:
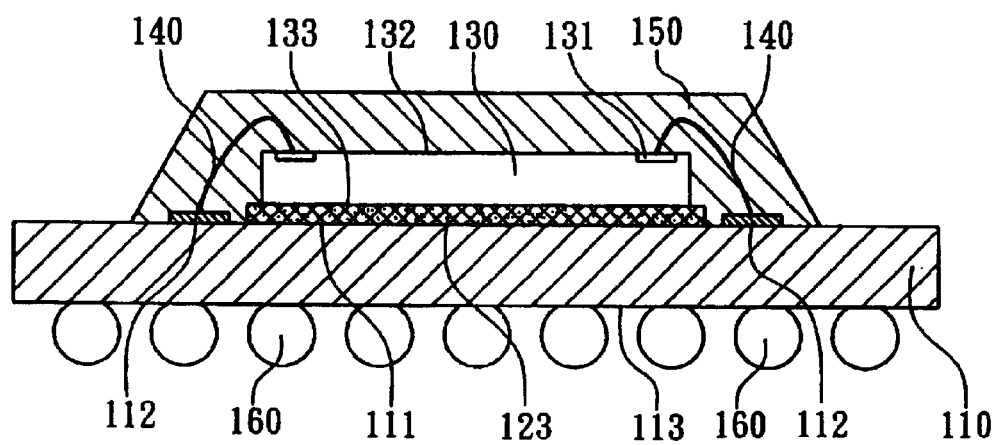

FIG. 5 is a cross sectional view of the integrated circuit package formed by the packaging process in accordance with the embodiment of the present invention.

Figure 6:
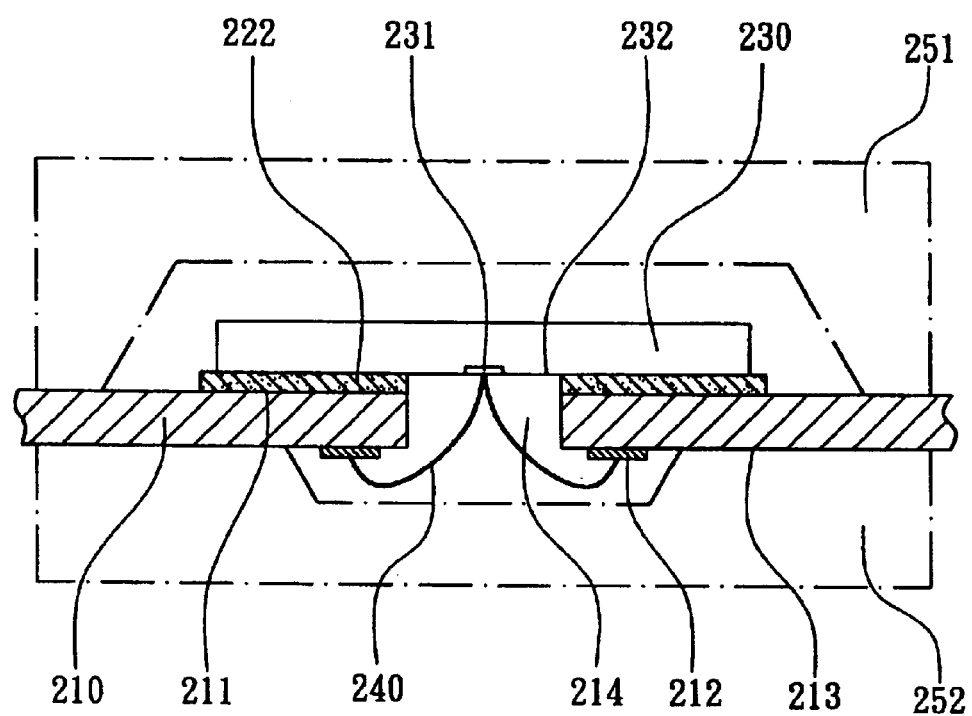

FIG. 6 is a cross sectional view of a substrate with an attached chip inside a mold in accordance with another embodiment of the present invention.

DETAILED DESCRIPTION OF THE PRESENT INVENTION

Referring to the drawings attached, the present invention will be described by means of the embodiments below.

Figure 1:
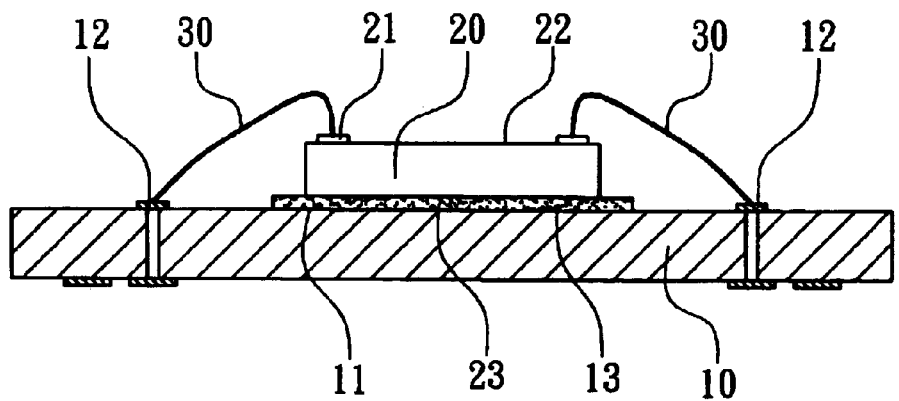
FIG. 1 is a cross sectional view of a substrate with an attached chip in a conventional integrated circuit packaging process.
Figure 2:
FIG. 2 is a photograph showing the effective chip-bonding area on the substrate in the conventional integrated circuit package.
Figure 3:
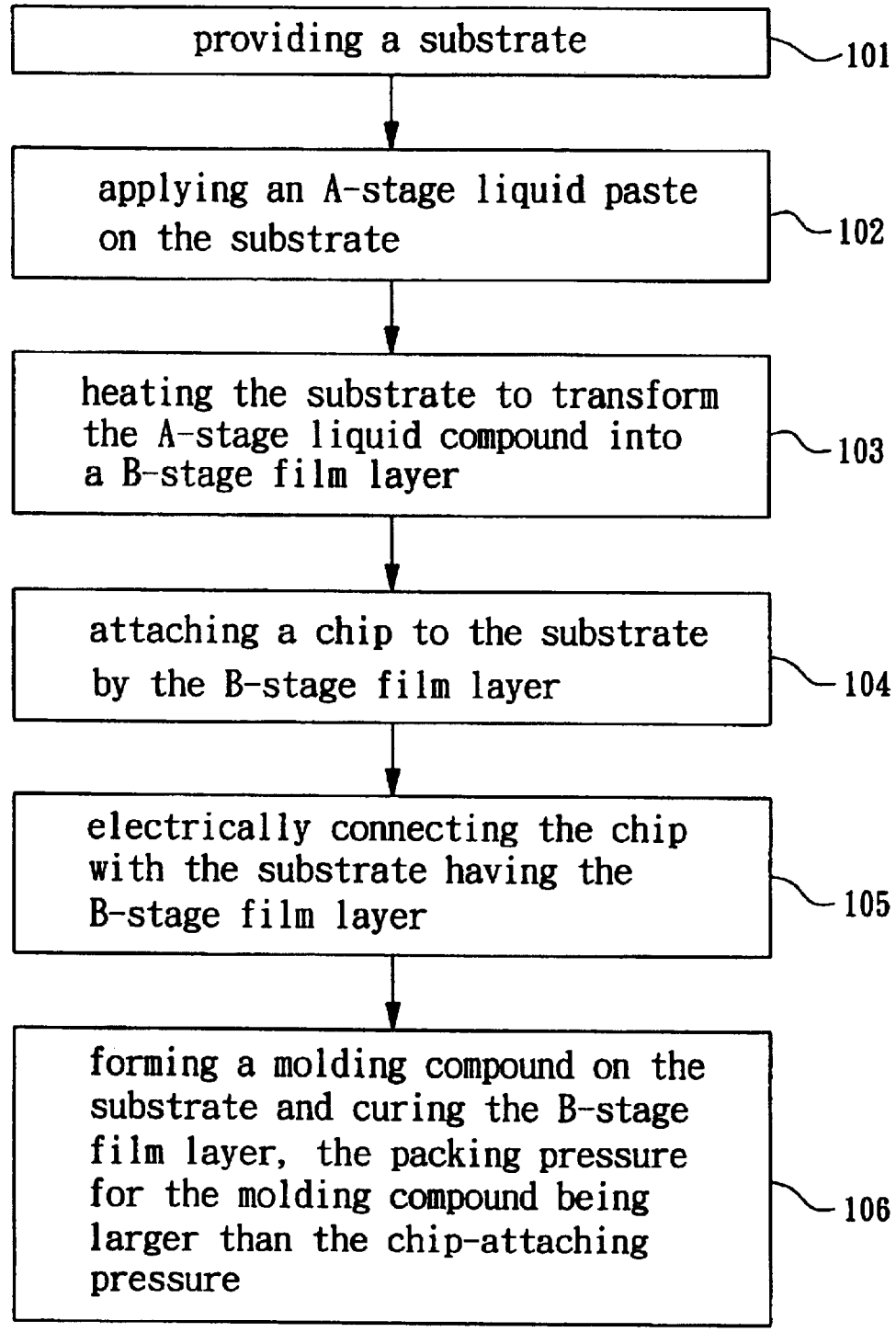
FIG. 3 is a flow chart of a packaging process for improving effective chip-bonding area in accordance with an embodiment of the present invention.

According to an embodiment of the present invention, the packaging process for improving effective chip-bonding area comprises the steps as showed in FIG. 3.

Figure 4A:
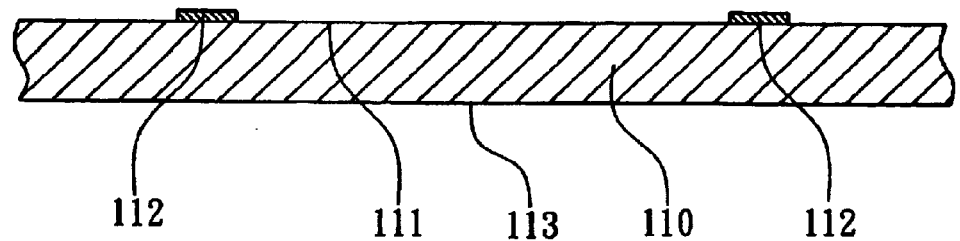

As showed in FIG. 3 and FIG. 4A, the first step 101 is to provide a substrate 110, the substrate 110 is a high density wiring substrate for integrated circuit package, such as BT printed circuit board, thin film wiring board or TAB tape. The substrate 110 has a chip-attaching surface 111, and a plurality of connect pads 112 (or fingers) are formed on the chip-attaching surface 111 for electrically connecting with the chip 130. But the location of the connect pads 112 is not limited, the connect pads 112 can be formed on the other surface of the substrate 110 in another instance. Advantageously, the other surface of the substrate 110 corresponding to the chip-attaching surface 111 is a surface-mounting surface 113 that is electrically connected with the chip-attaching surface 111 by vias.

Figure 4B:
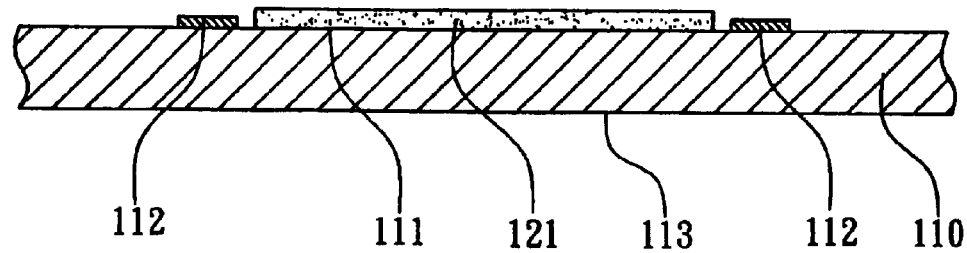

Next, as showed in FIG. 3 and FIG. 4B, an applying step 102 is executed. An A-stage liquid paste 121 is formed on the chip-attaching surface 111 of the substrate 110 to be used as a chip bond material. The A-stage liquid paste 121 may be formed by a liquid coating method, such as printing, screen printing, stencil printing, spraying, spin coating or dipping method. In this embodiment, the A-stage liquid paste 121 is formed by screen printing technique without covering the connect pads 112. The A-stage liquid paste 121 includes multi-stage thermosetting resins such as polyimide, polyquinolin or benzocyclobutene and a solvent that may dissolve the foregoing thermosetting resins such as the mixed solvent of butyrolactone and cyclopentanone or 1,3, 5-mesitylene. The glass transition temperature (Tg) of the A-stage liquid paste 121 should be between −40° C. and 10° C.

Figure 4C:
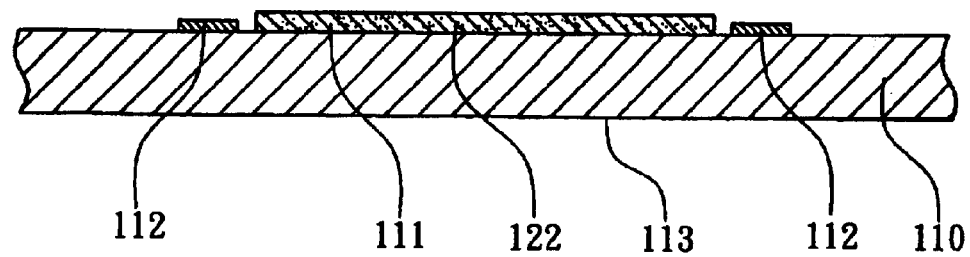

Next, as showed in FIG. 3 and FIG. 4C, the heating step 103 is followed. The substrate 110 is heated to pre-curing the A-stage liquid paste 121. The solvent of the A-stage liquid paste 121 is removed by heating, vacuum drying or ultra-violet rays curing so that the A-stage liquid paste 121 is transformed into a dry and adhesive B-stage film layer 122. The B-stage film layer 122 is thermoplastic and thermosetting property and generally is called "prepreg". The B-stage film layer 122 has a glass transition temperature (Tg) and a fully curing temperature. The B-stage film layer 122 is active to present various adhesive under various temperatures. The glass transition temperature (Tg) of the B-stage film layer 122 is between −10° C.~100° C. approximately, preferably between 35° C.~70° C. When the B-stage film layer 122 is under a temperature higher than the glass transition temperature (Tg) of the B-stage film layer 122 but lower than the fully curing temperature, the B-stage film layer 122 will becomes viscous and adhesive for attaching a chip. When the B-stage film layer 122 on the substrate 110 is under a temperature (about <35° C.) lower than the glass transition temperature of the B-stage film layer 122, such as room temperature, the B-stage film layer 122 will become a dry film without adhesive for transporting and storing the substrate 110. Also, the fully cured temperature of the B-stage film layer 122 is about 175° C. close to the molding temperature in the molding step 106.

Figure 4D:
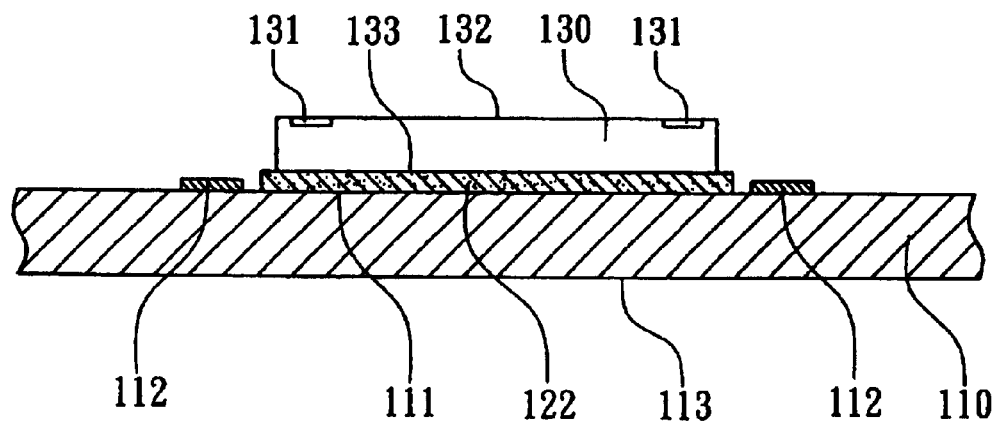

Then, as showed in FIG. 3 and FIG. 4D, the chip attaching step 104 is executed. A chip 130 is attached to the chip-attaching surface 111 of the substrate 110 under a raised temperature and a pressure, wherein the temperature for attaching the chip 130 should be higher than the glass transition temperature of the B-stage film layer 122. The B-stage film layer 122 becomes adhesive to bond the chip 130 with the substrate 110. In this embodiment, the back surface 133 of the chip 130 is bonded on the chip-attaching surface 111 of the substrate 110 by the B-stage film layer 122 according to correspondingly various packages. There are a plurality of the bonding pads 131 formed on the active surface 132 of the chip 130. It is important that the B-stage film layer 122 is maintained in a partially curing condition without fully curing the B-stage film layer 122 during the chip attaching step 104 and the electrically connecting step 105.

Figure 4E:
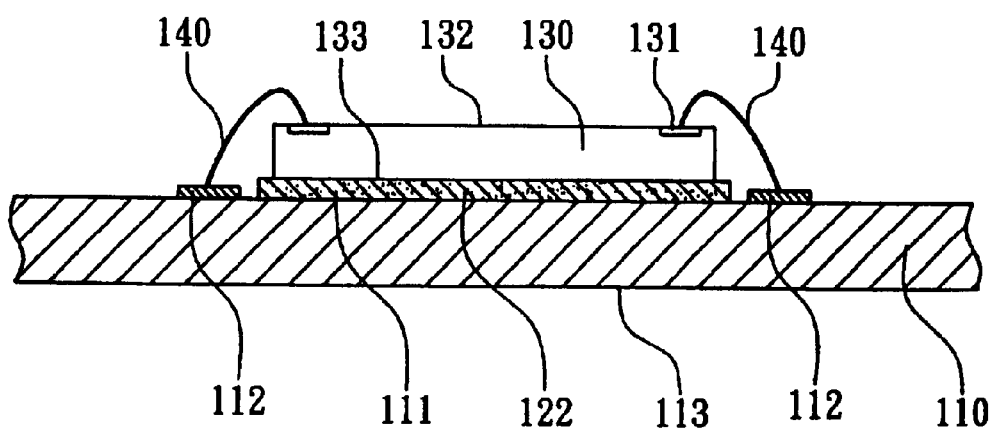

Thereafter, as showed in FIG. 3 and FIG. 4E, the electrically connecting step 105 is executed. The bonding pads 131 of the chip 130 are electrically connected with the connect pads 112 of the substrate 110 by the metal wires 140 that are formed by wire bonding. At this time, the B-stage film layer 122 is maintained without fully curing. Besides, tape automated bonding method (TAB) or other conventional techniques can be utilized for this electrical connection.

Figure 4F:
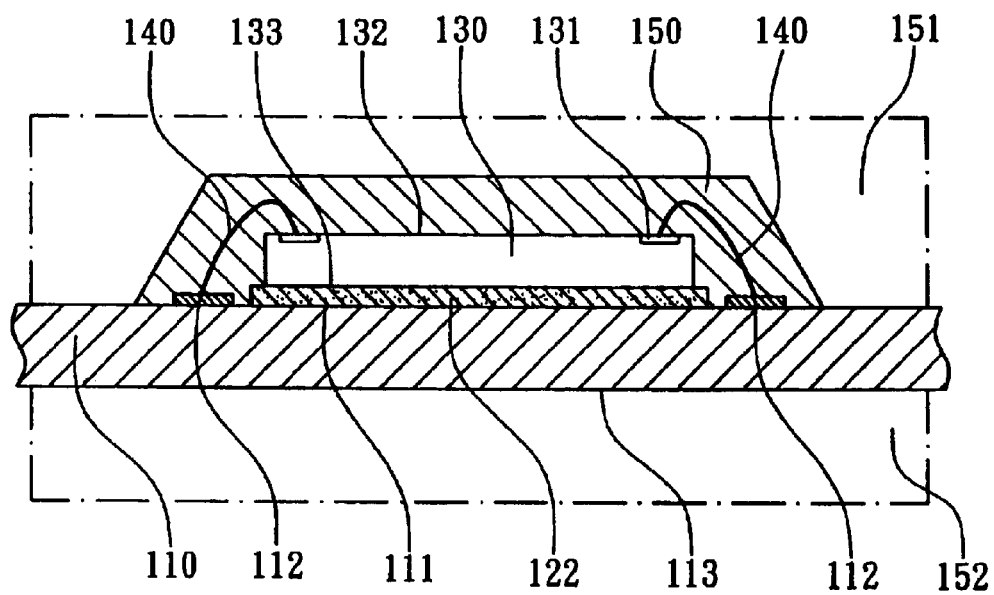

Finally, a showed in FIG. 3 and FIG. 4F, the molding step 106 is performed. The molding step 106 includes a filling sub-step and a packing sub-step for forming a molding compound 150 on the substrate 110 by molds 151,152. In the filling sub-step, the substrate 110 with the attached chip 130 and the B-stage film layer 122 is placed inside the mold cavity formed by an upper mold 151 and a lower mold 152. A molding compound 150 is filled into the mold cavity under a filling pressure until filling over 80 vol% of the mold cavity. The molding compound 150 includes thermosetting resin, curing agent, silicate filler, releasing wax and a few coloring agent. In the packing sub-step, the packing pressure higher than the filling pressure is applied to the molding compound 150 inside the mold cavity to remove voids in the molding compound 150 and the voids in the B-stage film layer 122. The packing pressure is preferably 1000 ps(6.9 MPa) to 1500 psi(10.2 MPa), which is larger than the chip attaching pressure mentioned in the chip attaching step 104. After completing the chip attaching step 104 and the electrically connecting step 105, the B-stage film layer 122 is still in partially curing condition and can be deformed suitably. The B-stage film layer 122 is closely compressed under the high packing pressure for the molding compound 150, so that the voids and gaps inside the B-stage film layer 122 will be removed so as to improve effective chip-bonding area between the chip 130 and the substrate 110. Preferably, the heating temperature in the molding step 106 for curing the molding compound 150 is about 150° C.–200° C. that matches the fully curing temperature of the molding compound 150, so that the B-stage film layer 122 and the molding compound 150 are cured simultaneously. After the molding step 106, the B-stage film layer 122 transformed into the C-stage film layer 123 (as showed in FIG. 5) to be a stable fixed film layer. In this embodiment, a step follows the molding step 106 to plant a plurality of solder balls 160 on the surface-mounting surface 113 of the substrate 110, then the substrate 110 is diced and separated to construct a ball grid array (BGA) package with excellent reliability. The packaging process for improving effective chip-bonding area of the present invention is suitable for various packages, especially for chip scale package (CSP). The B-state film layer 122 won't contaminate the connect pads 112 of the substrate 110, so that the connect pads 112 may be arranged to be closely near to the chip 130. Advantageously, after dicing the substrate 110 to form separate integrated circuit package, the chip-attaching surface 111 of the substrate 110 is not larger than 1.5 times the active surface 132 of the chip 130 in area so as to form a chip scale package (CSP).

Furthermore, the packaging process for improving effective chip-bonding area of the present invention can be utilized for other different packages. As showed in FIG. 6, a substrate 210 has a window 214, a B-stage film layer 222 is printed on a chip-attaching surface 211 of the substrate 210 for bonding the active surface 232 of the chip 230. The B-stage film layer 222 has a coating region larger than the active surface 232 of the chip 230. Bonding pads 231 are formed on the active surface 232 of the chip 230, the active surface 232 of the chip 230 is attached to the chip-attaching surface 211 of the substrate 210 corresponding to the window 214 to expose from the bonding pads 231. The bonding pads 231 of the chip 230 are electrically connected with the connect pads 212 of the substrate 210 by the bonding wires 240. The B-stage film layer 222 is not fully cured during the chip attaching step 104 and the electrically connecting step 105. When the substrate 210 is sealed by an upper mold 251 and a lower mold 252, the packing pressure for the molding compound 250 also make the B-stage film layer 222 be closely compressed in order to improve effective chip-bonding area.

The above description of embodiments of this invention is intended to be illustrated are not limiting. Other embodiments of this invention will be obvious to those skilled in the art in view of the above disclosure.

What is claimed is:

1. A process for making an integrated circuit package comprising:
   providing a substrate having a chip-attaching surface;
   applying an A-stage liquid paste on the chip-attaching surface of the substrate, the A-stage liquid paste including a thermosetting material and a solvent;
   heating the substrate to remove the solvent of the A-stage liquid paste in a manner that the A-stage liquid paste is transformed into a dry B-stage film layer;
   attaching a chip to the chip-attaching surface of the substrate using the B-stage film layer as an adhesive, the B-stage film layer being maintained in a partially cured condition;
   electrically connecting the chip with the substrate having the B-stage film layer; and
   forming a molding compound on the chip-attaching surface of the substrate, a packing pressure for the molding compound being larger than a chip-attaching pressure in a manner that the B-stage film layer re-bonds to the chip to improve effective chip-bonding area.

2. The process in accordance with claim 1, wherein the packing pressure is 1000 psi (6.9MPa) to 1500 psi (10.3 MPa) during the forming step of the molding compound.

3. The process in accordance with claim 1, wherein a temperature is provided from 150 C. to 200 C. during the forming step of the molding compound to transform the B-stage film layer into a C-stage film layer.

4. The process in accordance with claim 3, wherein the temperature in the forming step of the molding compound is larger than the temperature in the heating step of the substrate.

5. The process in accordance with claim 1, wherein the B-stage film has a glass transition temperature (Tg) higher than −10° C.

6. The process in accordance with claim 5, wherein the chip-attaching temperature is higher than the glass transition temperature (Tg) of the B-stage film layer.

7. The process in accordance with claim 1, wherein the A-stage liquid paste is applied by one of a group consisting of printing, screen printing, stencil printing, spraying, spin coating and dipping.

8. The process in accordance with claim 1, wherein the B-stage film layer is bonded to a back surface of the chip.

9. The process in accordance with claim 1, wherein the B-stage film layer is bonded to an active surface of the chip.

10. The process in accordance with claim 1, wherein the B-stage film layer and the molding compound are cured simultaneously during the forming step of the molding compound.

11. A process for making an integrated circuit package comprising:
    providing a substrate having a chip-attaching surface;
    applying an A-stage liquid paste on the chip-attaching surface of the substrate;
    heating a substrate to transform the A-stage liquid paste into a B-stage film layer;
    the B-stage film layer having a glass transition temperature (Tg);
    attaching a chip to the chip-attaching surface of the substrate, the substrate being heated higher than the glass transition temperature (Tg) of the B-stage film layer to make the B-stage film layer adhere to the substrate end with the chip, and the B-stage film layer being; maintained in a partially cured condition:
    electrically connecting the attached chip with to the substrate having the B-stage film layer; and
    forming a molding compound over the electrically-connected chip on the chip-attaching surface of the substrate, a packing pressure for the molding compound being larger than a chip-attaching pressure in a manner that the B-stage film layer re-bonds to the chip to improve effective chip-bonding area.

12. The process in accordance with claim 11, wherein the packing pressure is 1000psi (6.9mPa) to 1500 psi (10.3 MPa) during the forming step of the molding compound.

13. The process in accordance with claim 11, wherein the B-stage film layer and the molding compound are cured simultaneously during the forming step of the molding compound.

14. The process in accordance with claim 13, wherein a temperature is provided from 150° C. to 200° C. during the forming step of the molding compound to transform the B-stage film layer into a C-stage film layer.

15. The process in accordance with claim 11, wherein the glass transition temperature (Tg) of the B-stage film layer is higher than −10° C.

16. The process in accordance with claim 11, wherein the chip-attaching surface of the substrate is smaller than 1.5 times the active surface of the chip in area.

* * * * *